United States Patent [19]
Sampei et al.

[11] 4,422,108
[45] Dec. 20, 1983

[54] TAPE RECORDER

[75] Inventors: Tohru Sampei; Naoya Fujita; Shigemitsu Higuchi; Masamichi Yamada, all of Yokohoma; Kouichi Tomatsuri, Katsuta, all of Japan

[73] Assignee: Hitachi, Ltd., Tokyo, Japan

[21] Appl. No.: 383,958

[22] Filed: Jun. 1, 1982

Related U.S. Application Data

[63] Continuation of Ser. No. 66,652, Aug. 15, 1979.

[30] Foreign Application Priority Data

Aug. 16, 1978 [JP] Japan .................................. 53-99024
Aug. 16, 1978 [JP] Japan .................................. 53-99025
Sep. 28, 1978 [JP] Japan ................................. 53-117922
Sep. 28, 1978 [JP] Japan ................................. 53-117943

[51] Int. Cl.³ .......................... G11B 5/45; G11B 5/47
[52] U.S. Cl. ......................................... 360/65; 360/66
[58] Field of Search ........................ 360/25, 31, 65–68

[56] References Cited

U.S. PATENT DOCUMENTS 2,791,640  5/1957  Wolfe ..................................... 360/25

Primary Examiner—Vincent P. Canney
Attorney, Agent, or Firm—Antonelli, Terry & Wands

[57] ABSTRACT

A tape recorder comprises, in its signal recording path, a variable gain circuit compensating the sound recording sensitivity of a magnetic tape and two variable equalizers compensating the frequency characteristic of the magnetic tape in the intermediate and high frequency ranges respectively. Reference signals at three different frequencies are successively supplied to the signal recording path to be recorded on the magnetic tape, and the signals of different reference frequencies are successively reproduced from the magnetic tape to be then arithmetically processed so as to optimize the gain of the variable gain circuit and the degree of frequency characteristic compensation by the first and second variable equalizers.

11 Claims, 12 Drawing Figures

TAPE RECORDER

This is a continuation of Application Ser. No. 066,652 filed Aug. 15, 1979.

BACKGROUND OF THE INVENTION

1. Field of the Invention

This invention relates to a tape recorder in which the sensitivity of sound recording and the degree of recorded sound compensation can be automatically adjusted to be optimum depending on the type of a magnetic tape used for sound recording.

2. DESCRIPTION OF THE PRIOR ART

Tape recorders, especially, so-called cassette deck type ones have progressively been gaining popularity among many audio fans as a music source of audio apparatus. This is attributable principally to the improved performance of the cassette decks and also to the improved performance of the cassette tapes.

The cassette tapes presently available in the market are broadly classified into the normal type, the chrome ($CrO_2$) type, and the ferrichrome (FeCr) type. However, even the cassette tapes of the same type have different sound recording sensitivities and frequency characteristics depending on the maker, tape thickness, lot and other factors. Therefore, in order for the cassette tapes to exhibit their full performance, the sound recording sensitivity and frequency characteristic of each individual cassette tape must be adjusted to be optimum for the purpose of sound recording.

It has been a common practice in the prior art cassette decks that the sound recording sensitivity is optimized by manually adjusting the gain of the sound recording amplifier, and the frequency characteristic is optimized by changing over the equalizer by a change-over switch to one of the three stages depending on the type of the cassette tape. In one of the prior art cassette decks, a knob capable of fine adjustment of the equalization curve in the high frequency range of sound recording is provided so as to substantially flatten the frequency characteristic.

However, the provision of such a simple change-over switch and such a fine adjusting knob has not been completely successful for the desired exhibition of the full performance of the cassette tape.

SUMMARY OF THE INVENTION

It is therefore a primary object of the present invention to provide a novel and improved tape recorder in which the sound recording sensitivity and the frequency characteristic can be automatically adjusted to be optimum for the full exhibition of the performance of any one of the cassette tapes of the three types.

According to the present invention, the sound recording sensitivity and frequency characteristic of a cassette tape are automatically adjusted by causing traveling movement of the tape for a test run, supplying a plurality of reference signals of respectively different frequencies to a variable gain circuit for compensating the sound recording sensitivity, to an intermediate range variable equalizer for compensating the frequency characteristic in the intermediate frequency range and to a high-range variable equalizer for compensating the frequency characteristic in the high frequency range, recording these reference signals on the tape, reproducing the reference signals recorded on the tape, comparing each of the reproduced outputs with a reference value, and controlling the variable gain circuit and variable equalizers depending on the results of comparison so that they can be optimized for the sound recording.

DESCRIPTION OF THE PREFERRED EMBODIMENTS

Figure 1:
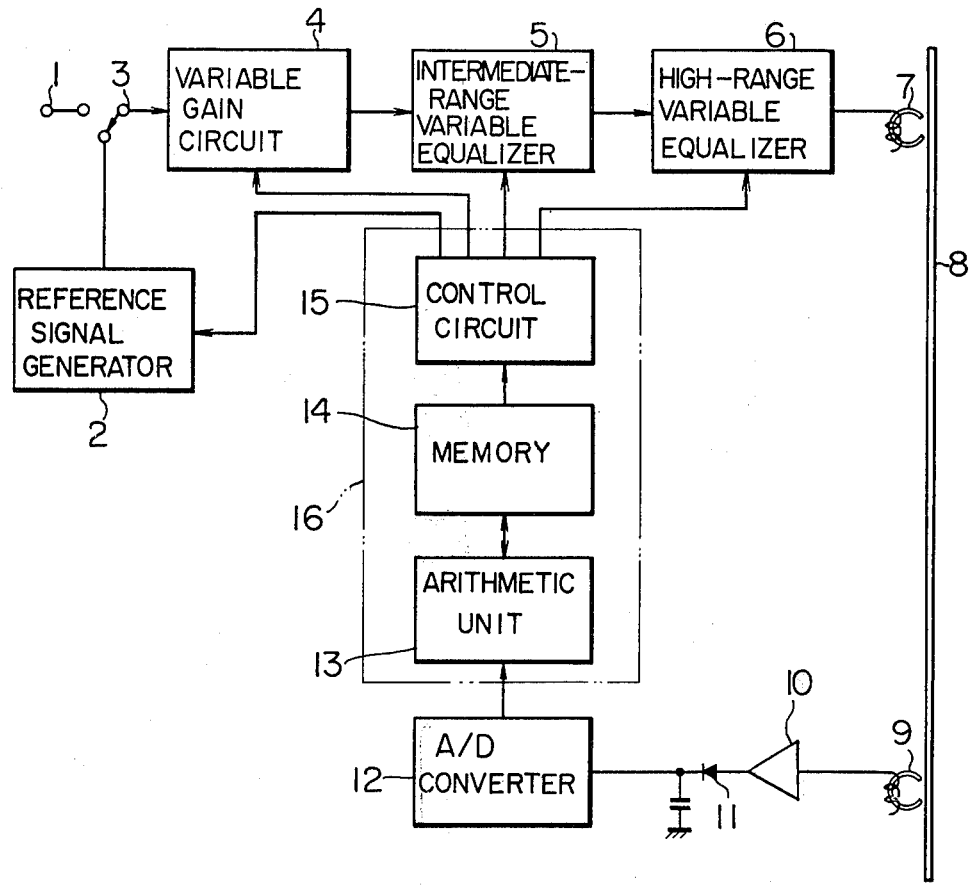
FIG. 1 is a block diagram of a first embodiment of the tape recorder according to the present invention.

FIG. 1 is a block diagram of a first preferred embodiment of the tape recorder according to the present invention. Referring to FIG. 1, the tape recorder comprises a recording signal input terminal 1, a reference signal generator 2 capable of successively generating a plurality of reference signals of 1 kHz, 7 kHz and 14 kHz in response to the application of a control signal, a change-over switch 3 for change-over between the recording signal and the reference signal, a variable gain circuit 4 whose gain is varied stepwise under control of the control signal, an intermediate-range variable equalizer 5 whose corner frequency is varied stepwise under control of the control signal, a high-range variable equalizer 6 whose peaking extent is varied stepwise under control of the control signal, a magnetic recording head 7, a magnetic tape 8, a magnetic reproducing head 9, a reproduced signal amplifier 10, a rectifier circuit 11, an A/D converter 12, an arithmetic unit 13, a memory 14, and a control circuit 15 generating the aforementioned control signal. The arithmetic unit 13, the memory 14 and the control circuit 15 above described may be parts of a microcomputer which is shown by the dotted block 16 in FIG. 1.

In the tape recorder having the construction shown in FIG. 1, the sound recording sensitivity and the frequency characteristic of the magnetic tape 8 are automatically adjusted in the steps described below, after switching the change-over switch 3 to the position in which the reference signal generator 2 is connected to the variable gain circuit 4.

In the first step, the first reference signal of 1 kHz is generated from the reference signal generator 2 to be recorded on the magnetic tape 8, and the signal reproduced from the magnetic tape 8 is then arithmetically processed in the microcomputer 16 to control the gain of the variable gain circuit 4 thereby compensating the sound recording sensitivity of the magnetic tape 8.

In the second step, the second reference signal of 7 kHz is generated from the reference signal generator 2 to be recorded on the magnetic tape 8, and the signal reproduced from the magnetic tape 8 is then arithmetically processed in the microcomputer 16 to control the corner frequency of the intermediate-range variable equalizer 5 thereby compensating the frequency characteristic of the magnetic tape 8 in the intermediate frequency range.

In the third step, the third reference signal of 14 kHz is generated from the reference signal generator 2 to be recorded on the magnetic tape 8, and the signal reproduced from the magnetic tape 8 is then arithmetically processed in the microcomputer 16 to control the peaking extent of the high-range variable equalizer 6 thereby compensating the frequency characteristic of the magnetic tape 8 in the high frequency range.

The control circuit 15 carrying out the above manner of control generates a digital control signal of parallel four bits to represent one of sixteen binary data ranging from "0,0,0,0" to "1,1,1,1" so as to finely control the variable gain circuit 4, intermediate-range variable equalizer 5 and high-range variable equalizer 6. Therefore, a D/A converter is incorporated in each of the circuit 4 and equalizers 5 and 6.

In the arithmetic processing carried out in each of the aforementioned three steps, the digital code obtained by the A/D conversion of the reproduced signal in the A/D converter 12 is compared in the arithmetic unit 13 with a corresponding reference value stored in the memory 14. As the result of comparison between the digital code and the reference value, the optimum binary data among the sixteen binary data specified above is selected to be stored in the memory 14, and the digital control signal indicative of the binary data appears from the control circuit 15.

The practical operation in the individual steps will now be described.

Figure 2:
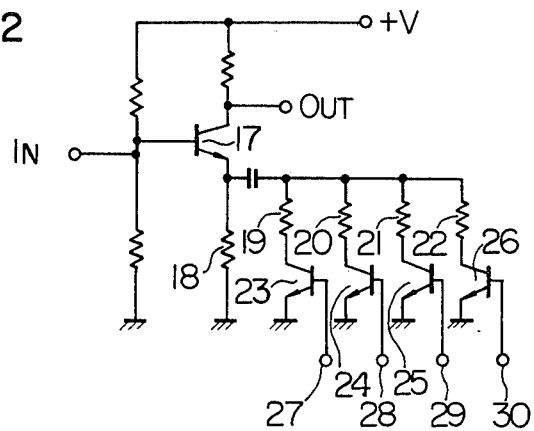
FIG. 2 is a circuit diagram of one form of the variable gain circuit in the embodiment shown in FIG. 1.

FIG. 2 is a circuit diagram of one form of the variable gain circuit 4 in the embodiment shown in FIG. 1. Referring to FIG. 2, the variable gain circuit 4 includes an amplifier circuit whose principal component is a transistor 17. When the resistance value of an emitter resistor 18 in this amplifier circuit is increased, the gain is reduced since the phase of the voltage drop across the emitter resistor 18 is inverse to that of the base input voltage. Based on this principle, a plurality of resistors 19, 20, 21 and 22 are connected in parallel with the emitter resistor 18 and are grounded through a plurality of switching transistors 23, 24, 25 and 26 respectively. The impedance values $Z_1$, $Z_2$, $Z_3$ and $Z_4$ of the respective resistors 19, 20, 21 and 22 are selected to satisfy the following relation:

$$Z_1 : Z_2 : Z_3 : Z_4 = 8 : 4 : 2 : 1$$

Thus, when a four-bit digital control signal comprising the combination of "0" and "1", in which "1" is a positive pulse, is applied from the control circuit 15 to the bases 27, 28, 29 and 30 of the respective switching transistors 23, 24, 25 and 26, any desired gain among the sixteen gains can be obtained.

In the aforementioned first step, the first reference signal of 1 kHz generated from the reference signal generator 2 is recorded on the magnetic tape 8, and the signal reproduced from the magnetic tape 8 is then detected to be converted into the corresponding digital code by the A/D converter 12. This digital signal is applied from the A/D converter 12 to the arithmetic unit 13 in the microcomputer 16 to be compared with the reference value stored in the memory 14. The arithmetic unit 13 computes the required amount of variation in the gain of the variable gain circuit 4 desired for the compensation of the sound recording sensitivity of the magnetic tape 8 in order that the desired reproduced output can be provided. The resultant data required for the control is stored in the memory 14, and at the same time, the corresponding digital control signal is applied from the control circuit 15 to the variable gain circuit 4 so as to compensate the sound recording sensitivity of the magnetic tape 8. Although the reference signal of 1 kHz is used for the above purpose, the frequency is not limited to the specified value but may be any suitable value between about 200 Hz and about 5 kHz, since the frequency characteristic of the cassette tapes of the three types referred to hereinbefore are substantially flat in this frequency range.

Before the adjustment of the sound recording sensitivity, the control circuit 15 applies a standard digital control signal to the variable gain circuit 4, to the intermediate-range variable equalizer 5 and to the high-range variable equalizer 6. This standard digital control signal may be a standard tape data or may be the central binary data "1,0,0,0" among the sixteen binary data.

Figure 3:
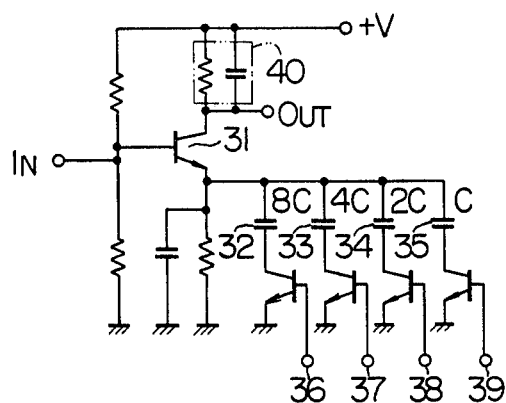
FIG. 3 is a circuit diagram of one form of the intermediate-range variable equalizer in the embodiment shown in FIG. 1.

The operation in the second step will now be described. FIG. 3 is a circuit diagram of one form of the intermediate-range variable equalizer 5 in the embodiment shown in FIG. 1. Referring to FIG. 3, this variable equalizer 5 includes an amplifier circuit including a transistor 31 similar to that shown in FIG. 2. The equalizer 5 further includes a high-range attenuator 40, and a plurality of capacitors 32, 33, 34 and 35 grounded through a plurality of switching transistors, respectively. In this equalizer 5, one or more of the capacitors 32, 33, 34 and 35 having the respective capacitance values of 8C, 4C, 2C and 1C are selected by the digital control signal applied from the control circuit 15 to the bases 36, 37, 38 and 39 of the respective switching transistors so that its corner frequency varies depending on the control signal.

Figure 4:
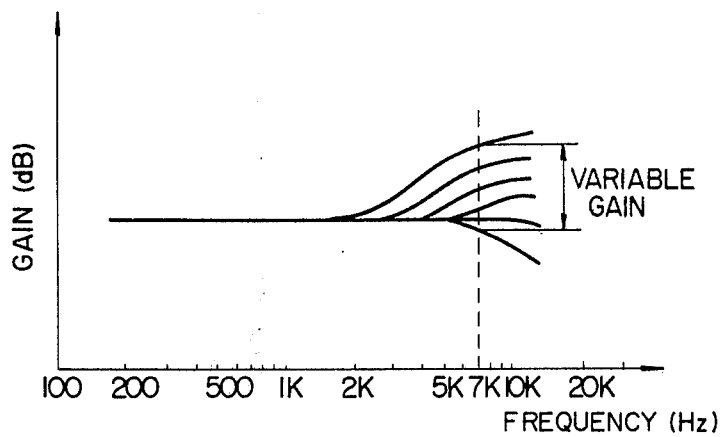
FIGS. 4 to 6 show the frequency characteristic curves compensated in the intermediate frequency range respectively.
Figure 5:
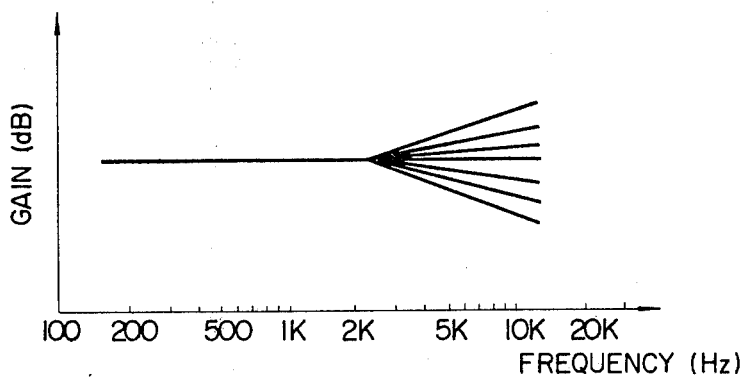
Figure 6:
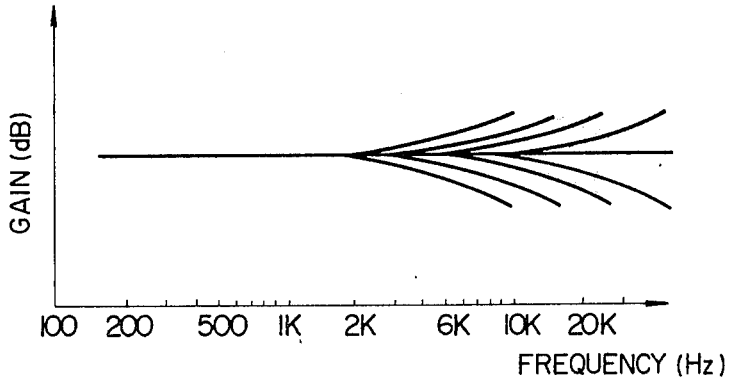

FIG. 4 shows the frequency characteristic of the circuit shown in FIG. 3. It will be seen from FIG. 4 that the other frequency is lowest when all of the capacitors 32 to 35 are active, while, with the decrease in the composite capacitance value, the corner frequency becomes higher and is attenuated by the action of the high-range attenuator 40. When the frequency characteristic of the magnetic tape 8 is not so satisfactory, the curve starts to drop at about 2 kHz, while when the frequency characteristic is considerably satisfactory, the curve starts to rise at about 5 kHz. Therefore, in order to cover all of these cases substantially, the circuit shown in FIG. 3 must be constructed so that the corner frequency is successively variable between about 2 kHz and about 6 kHz, or the inclination of the curve must be made variable with the corner frequency fixed at about 2 kHz as shown in FIG. 5. Further, in order to cover all the magnetic tape types available in the market and also cover the all the tape speeds, the corner frequency must be made variable between about 2 kHz and about 10 kHz as shown in FIG. 6.

For the purpose of the compensation of the frequency characteristic in the intermediate frequency range, the second reference signal of 7 kHz is generated from the reference signal generator 2 to be recorded on the magnetic tape 8. The signal reproduced from the magnetic tape 8 is subjected to the A/D conversion in the A/D converter 12, and the digital output signal of the A/D converter 12 is compared with the corresponding reference value in the arithmetic unit 13. Suppose, for example, that the initial digital control signal applied to the circuit shown in FIG. 3 is a binary data "1,0,0,0", and it is proved that the capacitance value 2C of the capacitor 34 must be added for the compensation of the frequency characteristic in the intermediate frequency range. Then, the binary data "1,0,1,0" is stored in the memory 14, and at the same time, the digital control signal of "1,0,1,0" is applied from the control circuit 15 to the bases or control terminals 36, 37, 38 and 39 respectively to complete the compensation of the frequency characteristic in the intermediate frequency range. Although the reference signal of 7 kHz is used for the purpose of the above compensation, the frequency is not limited to the specified value and may be any suitable value between about 2 kHz and about 10 kHz in practical applications. However, due to the fact that the sound recording sensitivity of the magnetic tape 8 will be abruptly degraded at a frequency higher than 10 kHz, the two-point approximation will result in an excessive error, and it is therefore undesirable to select the frequency of this second reference signal to be higher than 10 kHz.

Figure 7:
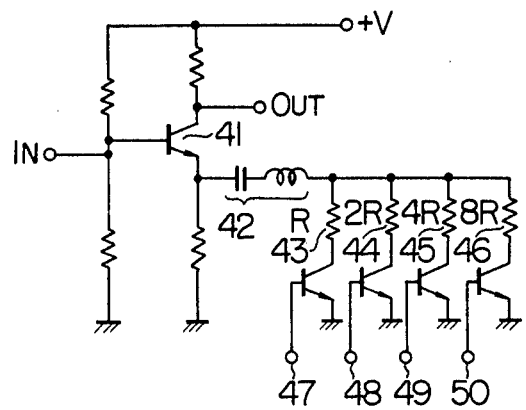
FIG. 7 is a circuit diagram of one form of the high-range variable equalizer in the embodiment shown in FIG. 1.
Figure 8:
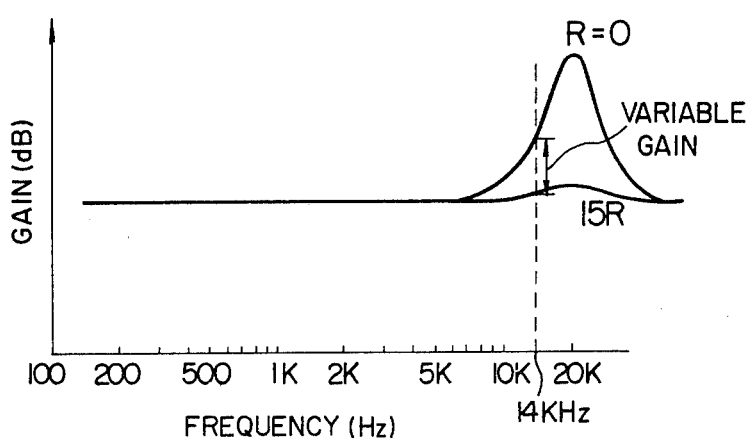
FIG. 8 shows the frequency characteristic curve compensated in the high frequency range.

The operation in the aforementioned third step will now be described. FIG. 7 is a circuit diagram of one form of the high-range variable equalizer 6 in the embodiment shown in FIG. 1. Referring to FIG. 7, this variable equalizer 6 includes an amplifier circuit including a transistor 41 similar to that shown in FIG. 3. The equalizer 6 further includes a resonant circuit 42 and a plurality of resistors 43, 44, 45 and 46 grounded through a plurality of switching transistors respectively. These resistors 43 to 46 have the resistance values of 1R, 2R, 4R and 8R respectively. One or more of these resistors 43, 44, 45 and 46 are selected by the digital control signal applied from the control circuit 15 to the bases or control terminals 47, 48, 49 and 50 so that the quality factor Q of the resonant circuit 42 makes a corresponding variation. The resonant frequency of this resonant circuit 42 is selected at 20 kHz as shown in FIG. 8. However, this resonant frequency can be increased to a value higher than 20 kHz when the tape speed is so high that the frequency band can be further extended. This resonant frequency must be lower than about 15 kHz when the frequency characteristic of the reproducing head 9 is not so satisfactory, and the frequency band cannot be extended to 20 kHz. Further, this resonant frequency must be lowered to, for example, 10 kHz or 5 kHz when the tape speed is reduced to ½ or ¼ of the normal speed. Although the quality factor Q of the resonant circuit 42 in the equalizer 6 shown in FIG. 7 is varied for the purpose of compensation, the resonant frequency itself may be varied for the same purpose.

The third reference signal of 14 kHz is generated from the reference signal generator 2 to be recorded on the magnetic tape 8 for the purpose of the compensation of the frequency characteristic in the high frequency range. In this case too, the signal reproduced from the magnetic tape 8 is compared with the corresponding reference value in the arithmetic unit 13 after the A/D conversion, so that the optimum digital control signal can be applied from the control circuit 15 to this variable equalizer 6. Although the reference signal of 14 kHz is used for the purpose of the above compensation, the frequency is not limited to the specified value, and it may have any other suitable value provided that the operating characteristic of the high-range variable equalizer 6 can be detected.

The above steps can flatten the frequency characteristic relative to the gain of recording and reproduction. In the embodiment described with reference to FIG. 1, the frequency characteristic has been compensated by the measurement using the three frequencies, that is, 1 kHz, 7 kHz and 14 kHz. The accuracy of compensation can be improved by further dividing the compensation circuit and increasing the number of the reference signals. In any case, the process of compensation must proceed in a sequential order of from a lower frequency to a higher frequency. This is because the frequency characteristic in the high frequency range is affected by the result of compensation of the frequency characteristic in the intermediate frequency range. The gain may be compensated before or after the compensation of the frequency characteristic since it does not affect the compensation of the frequency characteristic.

It will be appreciated from the above description of the first embodiment of the present invention that the optimum gain and the optimum degree of recorded sound compensation can be automatically provided for the type of the magnetic tape mounted in the tape recorder, and the frequency characteristic can be flattened.

The oscillation frequency of the oscillation circuit in the reference signal generator 2 can be changed over by changing the constants of the elements of the oscillation circuit by the four-bit digital control signal applied from the control circuit 15.

Figure 9:
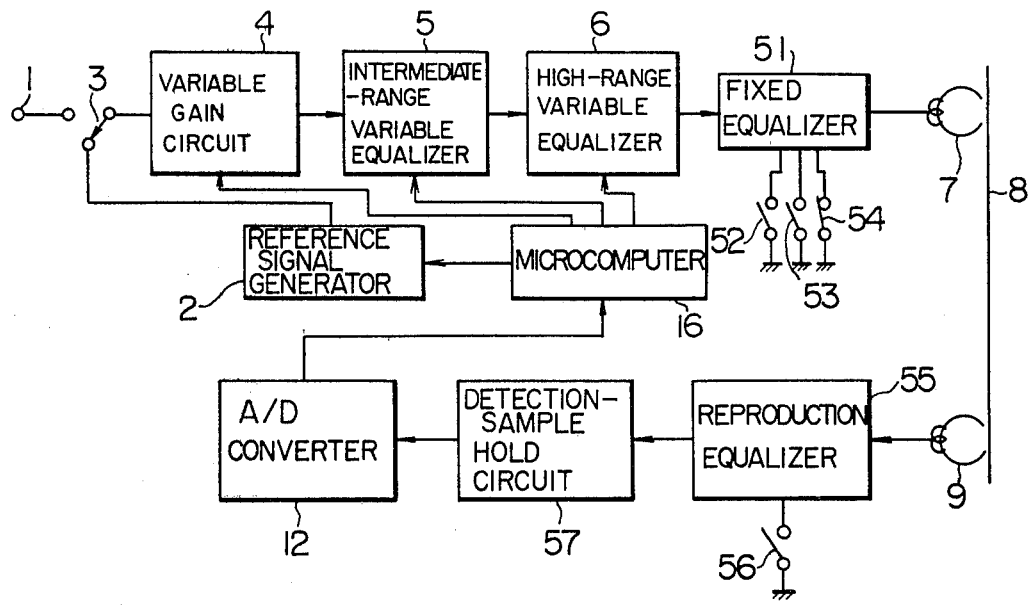
FIG. 9 is a block diagram of a second embodiment of the present invention.

In the first embodiment of the present invention, the variable equalizers are not specifically adapted for the compensation of the frequency characteristic of all the types of magnetic tapes. For the purpose of this manner of compensation, a fixed equalizer capable of exhibiting different frequency characteristics depending on the tape type may be additionally provided. A modification comprising such a fixed equalizer is shown in FIG. 9. Referring to FIG. 9, a fixed equalizer 51 is inserted in the signal recording path between the variable equalizer 6 and the recording head 7 and is grounded through three change-over switches 52, 53 and 54 so that it can exhibit a frequency characteristic corresponding to any one of the three tape types when one of these switches 52 to 54 is selectively turned on. The provision of this fixed equalizer 51 is advantageous in that the variable range of the variable equalizers can be narrowed, the accuracy per bit can be improved and the number of required bits can also be decreased. The modification shown in FIG. 9 includes a reproduction equalizer 55, a change-over switch 56 associated with this equalizer 55, and a detection and sample holding circuit 57.

The arranged order of the variable equalizers 5, 6 and the fixed equalizer 51 in the signal recording path is not limited to that illustrated in FIG. 9, and they may be arranged in any desired order. Also, the fixed equalizer change-over switches 52 to 54 and the reproduction equalizer change-over switch 56 may be arranged to operate in an interlocking relationship.

In the embodiment shown in FIG. 9, the frequency characteristic of the fixed equalizer 51 will be changed over to another and the composite variable range of the fixed and variable equalizers will be subject to a variation when an undesired one of the fixed equalizer change-over switches 52 to 54 is actuated or deactuated by mistake during the automatic adjustment of the frequency characteristic of the variable equalizers 5 and 6.

In such a case, the value of the output signal from the A/D converter 12 will not coincide with the reference value set in the memory 14 due to the variation in the composite variable range of the equalizers, and the variable equalizers 5 and 6 will not be placed under the optimized control.

Such trouble can be obviated by inhibiting the change-over of the frequency characteristic of the fixed equalizer 51 during the automatic adjustment of the variable range of the variable equalizers 5 and 6. Such a modification is shown in FIG. 10.

Figure 10:
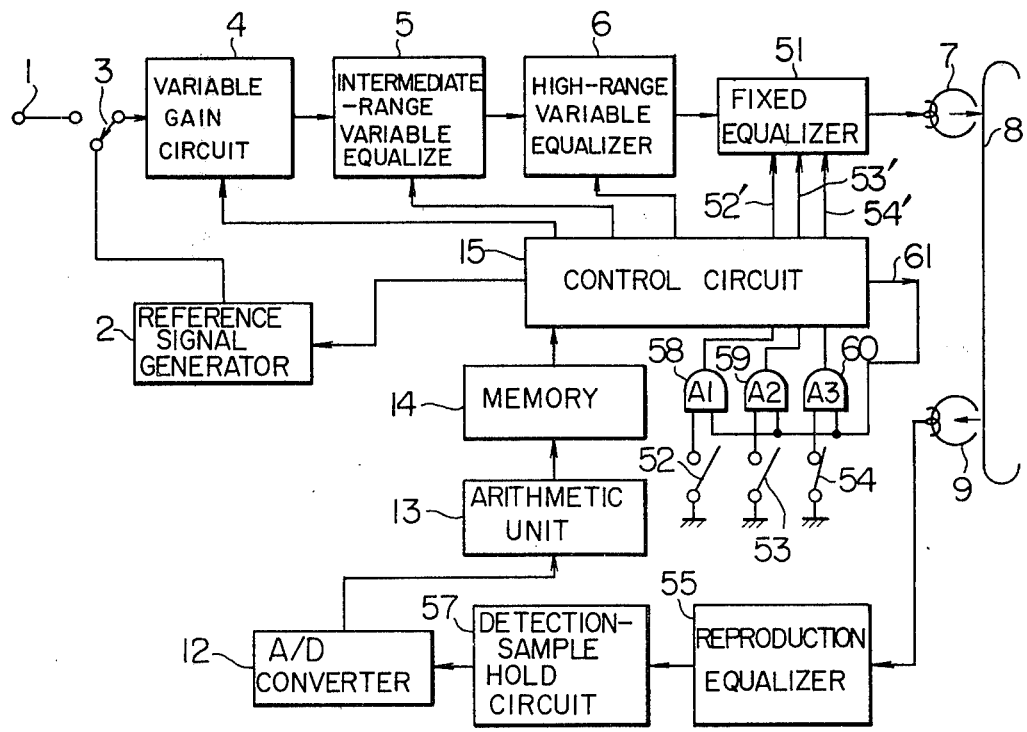
FIG. 10 is a block diagram of an improvement in the embodiment shown in FIG. 9.

Referring to FIG. 10, the modification of FIG. 9 is featured by the fact that a logic circuit composed of two-input AND gates 58, 59 and 60 is additionally provided. In FIG. 10, the switches 52, 53 and 54 are connected to one of the two input terminals of the two-input AND gates 58, 59 and 60 respectively, and a tape control signal 61 appearing at an output terminal of the control circuit 15 is connected to the other input terminal of each of the AND gates 58, 59 and 60. In FIG. 10, the switch 54 is turned on to apply an input signal of logical level "1" or high level to the associated AND gate 60. (This logic circuit is actually composed of MOS transistors to which a negative voltage is applied, and therefore, the grounded level provides a logical level "1".) The tape control signal 61 is such that it takes a logical level "1" before and after the automatic adjustment of the variable equalizers 5 and 6 and a logical level "0" during the automatic adjustment of the variable equalizers 5 and 6. This tape control signal 61 is not a new signal especially prepared for the purpose of the present invention, but, it is, for example, the signal which is primarily used for controlling the display circuit displaying the automatic adjustment of the variable equalizers 5 and 6, or the signal which is primarily used for changing over between the recording signal applied to the input terminal 1 and the reference signal generated from the reference signal generator 2 for the purpose of the automatic adjustment of the variable equalizers 5 and 6.

Before the automatic adjustment of the variable equalizers 5 and 6, the tape control signal 61 is in its "1" level and is applied to the AND gate 60 only together with the output signal of "1" level from the switch 54. Consequently, the AND gate 60 only is turned on, and a tape type indication signal 54' of "1" level is applied from the control circuit 15 to the fixed equalizer 51 to change over the frequency characteristic of this equalizer 51 according to the change-over information. Then, when a test switch (not shown) is actuated, the tape control signal 61 is turned into its "0" level from the "1" level, and no outputs appear from the AND gates 58 to 60. Therefore, even when any one of the switches 52 and 53 may be actuated, by mistake during the automatic adjustment of the variable equalizers 5 and 6, the tape type indication signals 52', 53' and 54' are held in their previous states, and the fixed equalizer 51 would not be changed over from the set state. Further, even when the switch 54 may be actuated again, the fixed equalizer 51 would not be reset, and there is no need to change-over the fixed equalizer 51 again.

In the tape recorder system, the automatic adjustment must be done by actuating the test switch in the signal recording condition with the magnetic tape 8 travelling past the recording head 7. When the automatic adjustment is done in the non-travelling condition of the magnetic tape 8 or in the signal reproducing condition, the equalizers including the variable equalizers 5 and 6 may not be placed under the optimized control.

Such trouble can be obviated by an arrangement in which an automatic adjustment starting signal is generated only when a recording indicative signal, a tape travelling indicative signal and a test switch turn-on indicative signal are present or appear simultaneously.

Figure 11:
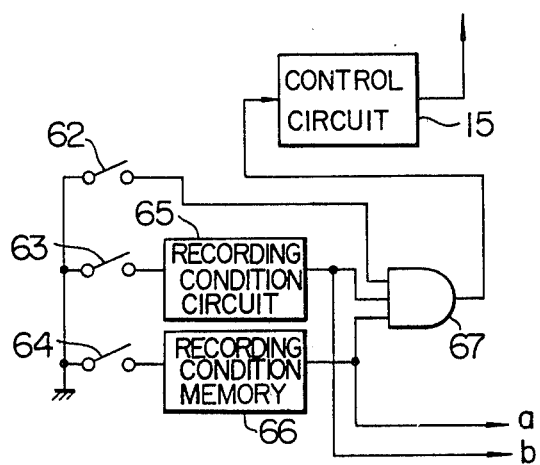
FIGS. 11 and 12 are block diagrams of two forms of a starter circuit preferably employed in the present invention respectively.
Figure 12:
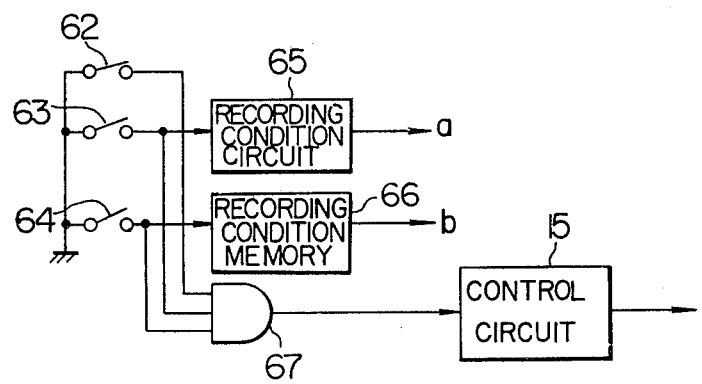

FIGS. 11 and 12 show two forms of a starter circuit preferably employed in the automatic adjustment device forming part of the present invention so as to meet the above requirement.

In each of FIGS. 11 and 12, the starter circuit for starting the operation of the automatic adjustment device includes a test switch 62, a signal recording switch 63, a signal reproducing switch 64, a signal recording condition memory 65, a signal reproducing condition memory 66, an AND gate 67, a reproduction indicative signal output terminal a and a recording indicative signal output terminal b. When the test switch 62 is depressed in the starter circuit of the above construction, no automatic adjustment starting signal is applied from the AND gate 67 to the control circuit 15 unless output signals appear simultaneously from the recording condition memory 65 and reproducing condition memory 66 in FIG. 11 or unless output signals appear simultaneously from the switches 63 and 64 in FIG. 12. Therefore, the automatic adjustment device operates only when the test switch 62 is actuated in the recording and reproducing condition.

We claim:

1. A tape recorder including means for recording a signal through a signal recording path onto a magnetic tape and means for reproducing the signal recorded on said magnetic tape, comprising:
   (a) a variable gain circuit inserted in the signal recording path for compensating the sound recording sensitivity of the magnetic tape;
   (b) a first variable equalizer inserted in the signal recording path for compensating the frequency characteristic of the magnetic tape in the intermediate frequency range;
   (c) a second variable equalizer inserted in the signal recording path for compensating the frequency characteristic of the magnetic tape in the high frequency range;
   (d) a reference signal generator respectively supplying reference signals at different frequencies to said signal recording path; and
   (e) control means for controlling said variable gain circuit, said first variable equalizer and said second variable equalizer based on the output of said reproducing means.

2. A tape recorder as claimed in claim 1, further comprising a fixed equalizer inserted in the signal recording path, said fixed equalizer exhibiting a plurality of frequency characteristics corresponding to a plurality of tape types respectively.

3. A tape recorder as claimed in claim 1 or 2, wherein said control means comprises:
   (a) A/D converter means for A/D conversion of the output of said reproducing means;
   (b) arithmetic operation means for processing the output of said A/D converter means with a reference value;
   (c) memory means for storing both said reference value and the output of said arithmetic operation means; and (d) a control circuit controlling said variable gain circuit, said first variable equalizer and said second variable equalizer based on the output of said arithmetic operation means.

4. A tape recorder as claimed in claim 2, further comprising logical operation means for making logical operation on a tape type indication signal and the output of said control means, whereby the change-over of the frequency characteristic of said fixed equalizer is inhibited by the output of said control means during the operation of said control means.

5. A tape recorder as claimed in claim 1, further comprising discriminating means for sensing a recording condition indicative signal, a reproducing condition indicative signal and a test switch turn-on indicative signal, whereby said control means can be placed in operation only when said discriminating means senses all of said three kinds of signals.

6. A tape recorder according to claim 1, wherein said control means comprises a microcomputer.

7. A method of adjusting automatically recording conditions of a magnetic recording and reproducing apparatus to each individual magnetic tape, the apparatus including means for recording a signal through a signal recording path on a magnetic tape and means for reproducing the signal recorded on said magnetic tape, comprising the steps of:
   (a) applying initial digital control signals to a variable gain amplifier for compensating the sound recording sensitivity of the magnetic tape, a first variable equalizer for compensating the frequency characteristic of the magnetic tape in the intermediate frequency range and a second variable equalizer for compensating the frequency characteristic of the magnetic tape in the high frequency range, all of which are inserted in the signal recording path;
   (b) supplying a first reference signal having a low frequency to the signal recording path;
   (c) recording said first reference signal on the magnetic tape by the recording means;
   (d) reproducing said first reference signal recorded on the magnetic tape by the reproducing means;
   (e) comparing said first reference signal reproduced from the magnetic tape with a reference value;
   (f) renewing said initial digital control signal to said variable gain amplifier in response to the difference between said first reference signal and said reference value;
   (g) repeating the steps (c)-(f) for said initial digital control signal to said first variable equalizer by using a second reference signal having an intermediate frequency instead of said first reference signal; and
   (h) repeating the steps (c)-(f) for said initial digital control signal to said second variable equalizer by using a third reference signal having a high frequency instead of said first reference signal.

8. A tape recorder including means for recording a signal through a signal recording path onto a magnetic tape and means for reproducing the signal recorded on said magnetic tape, comprising at least:
   (a) a variable gain circuit inserted in the signal recording path for compensating the sound recording sensitivity of the magnetic tape;
   (b) a first variable equalizer inserted in the signal recording path for compensating the frequency characteristic of the magnetic tape in the intermediate frequency range;
   (c) a second variable equalizer inserted in the signal recording path for compensating the frequency characteristic of the magnetic tape in the high frequency range;
   (d) a reference signal generator respectively supplying reference signals at different frequencies to said variable gain circuit, to said first variable equalizer and to said second variable equalizer respectively; and
   (e) control means for controlling said variable gain circuit, said first variable equalizer and said second variable equalizer based on the output of said reproducing means.

9. A magnetic tape recording and reproducing apparatus automatically adjustable to each individual magnetic tape, comprising:
   a source for producing a plurality of reference signals at different frequencies;
   a variable gain amplifier for amplifying said reference signals for compensating the sound recording sensitivity of the magnetic tape, said amplifier normally serving to amplify a recording signal;
   equalizer means for equalizing said reference signals for compensating the frequency characteristic of said magnetic tape in the intermediate and high frequency ranges, said equalizer means normally serving to equalize said recording signal;
   a recording transducer for recording said reference signals on the magnetic tape, said recording transducer normally serving to record said recording signal;
   a reproducing transducer for reproducing said reference signals recorded on the magnetic tape, said reproducing transducer normally serving to reproduce said recording signal;
   control means for supplying a gain control signal and a frequency response control signal to said variable gain amplifier and said equalizer means, respectively;
   a memory for storing at least a reference value; and
   arithmetic means for comparing an output of said reproducing transducer for each of said reference signals with said reference value and renewing said gain control signal and said frequency response control signal.

10. A magnetic tape recording and reproducing apparatus according to claim 9, wherein said control means comprises a microcomputer.

11. A magnetic tape recording and reproducing apparatus according to claim 6, wherein said control means, said memory and said arithmetic means comprises a microcomputer.

* * * * *

UNITED STATES PATENT AND TRADEMARK OFFICE
CERTIFICATE OF CORRECTION

PATENT NO. : 4,422,102

DATED : December 20, 1983

INVENTOR(S) : YASUYUKI TAMURA

It is certified that error appears in the above-identified patent and that said Letters Patent is hereby corrected as shown below:

Column 6

Line 65, change "2nd" to --second--.

Signed and Sealed this

First Day of May 1984

[SEAL]

Attest:

GERALD J. MOSSINGHOFF

Attesting Officer

Commissioner of Patents and Trademarks